US012754479B2

(12) United States Patent

Shimizu et al.

(10) Patent No.: US 12,754,479 B2

(45) Date of Patent: Oct. 6, 2026

(54) EUV RESIST UNDERLAYER FILM-FORMING COMPOSITION

(71) Applicant: NISSAN CHEMICAL CORPORATION, Tokyo (JP)

(72) Inventors: Shou Shimizu, Toyama (JP); Ryuta Mizuochi, Toyama (JP); Mamoru Tamura, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 760 days.

(21) Appl. No.: 18/012,736

(22) PCT Filed: Jul. 19, 2021

(86) PCT No.: PCT/JP2021/026910

§ 371 (c)(1),
(2) Date: Dec. 23, 2022

(87) PCT Pub. No.: WO2022/019248

PCT Pub. Date: Jan. 27, 2022

(65) Prior Publication Data

US 2023/0244148 A1 Aug. 3, 2023

(30) Foreign Application Priority Data

Jul. 20, 2020 (JP) ................................. 2020-123724

(51) Int. Cl.

*G03F 7/11* (2006.01)
*C08G 63/685* (2006.01)
*C09D 167/02* (2006.01)
*H10P 76/20* (2026.01)
*G03F 7/20* (2006.01)

(52) U.S. Cl.

CPC ............ *G03F 7/11* (2013.01); *C08G 63/6858* (2013.01); *C09D 167/02* (2013.01); *H10P 76/204* (2026.01); *H10P 76/2042* (2026.01); *G03F 7/2004* (2013.01)

(58) Field of Classification Search

CPC ....... G03F 7/11; G03F 7/095; C08G 63/6858; C09D 167/02

See application file for complete search history.

(56) References Cited

U.S. PATENT DOCUMENTS

| | | | | |
|---|---|---|---|---|
| 2013/0189533 | A1* | 7/2013 | Okuyama | H01L 21/308 428/524 |
| 2020/0131376 | A1 | 4/2020 | Tokunaga et al. | |
| 2021/0311396 | A1 | 10/2021 | Ogata et al. | |

FOREIGN PATENT DOCUMENTS

| | | | | |
|---|---|---|---|---|
| JP | 2005-352133 A | | 12/2005 | |
| JP | WO2011/074494 | * | 6/2011 | G03F 7/11 |
| JP | 2015-143360 A | | 8/2015 | |
| TW | 201400987 A | | 1/2014 | |
| TW | 202020006 A | | 6/2020 | |
| WO | 2010/074075 A1 | | 7/2010 | |
| WO | 2018/203464 A1 | | 11/2018 | |
| WO | 2020/026834 A1 | | 2/2020 | |

OTHER PUBLICATIONS

English Translation of JpWo2011/074494 (Year: 2011).*
Sep. 21, 2021 Search Report issued in International Patent Applicatio No. PCT/JP2021/026910.
Jan. 24, 2023 International Preliminary Report on Patentability issued in International Patent Application No. PCT/JP2021/026910.
Jun. 10, 2025 Office Action issued in Taiwanese Patent Application No. 110126386.

* cited by examiner

*Primary Examiner* — Daborah Chacko-Davis
(74) *Attorney, Agent, or Firm* — Oliff PLC

(57) ABSTRACT

A composition for forming a resist underlayer film that enables the formation of a desired resist pattern; a method for producing a resist pattern and producing a semiconductor device, which uses this composition for forming a resist underlayer film. A composition for forming an EUV resist underlayer film, said composition containing an organic solvent and a reaction product of a diepoxy compound and a compound represented by formula (1). (In formula (1), Y1 represents an alkylene group having from 1 to 10 carbon atoms, wherein at least one hydrogen atom is substituted by a fluorine atom; each of T1 and T2 independently represents a hydroxy group or a carboxy group; each of R1 and R2 independently represents an alkyl group having from 1-10 carbon atoms, said alkyl group being optionally substituted by a fluorine atom; and each of n1 and n2 independently represents an integer from 0 to 4.)

6 Claims, 1 Drawing Sheet

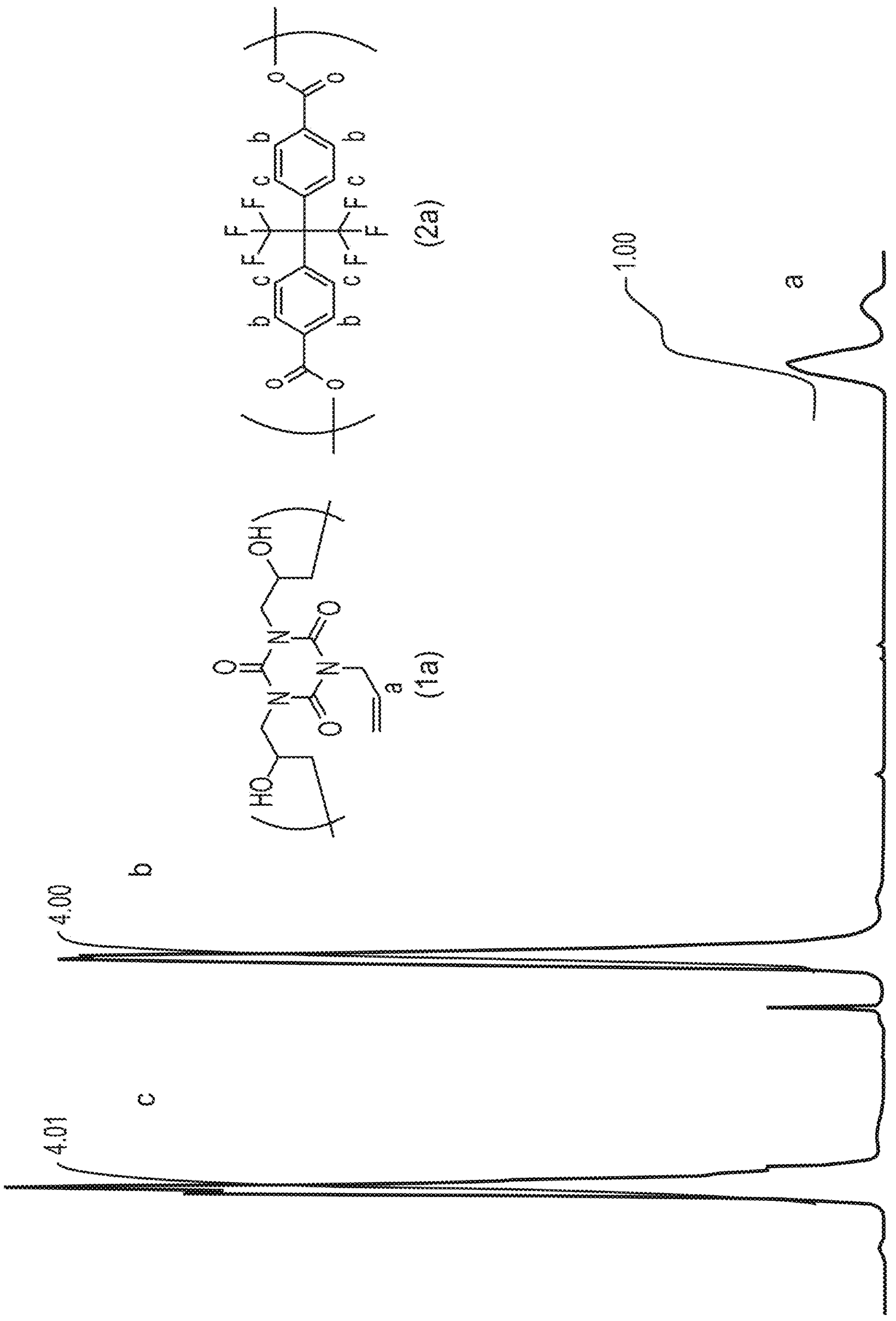
(2a)
(1a)

EUV RESIST UNDERLAYER FILM-FORMING COMPOSITION

TECHNICAL FIELD

The present invention relates to a composition used in a lithography process, particularly in a leading-edge (for example, ArF, EUV or EB) lithography process, for semiconductor production. It also relates to a method for producing a resist-patterned substrate and to a method for manufacturing a semiconductor device by the application of a resist underlayer film from the composition.

BACKGROUND ART

The manufacturing of semiconductor devices has conventionally involved lithographic microprocessing using a resist composition. In the microprocessing, a thin film of a photoresist composition is formed on a semiconductor substrate such as a silicon wafer and is irradiated with an active ray such as ultraviolet light through a mask pattern for drawing a device pattern. The latent image is then developed, and the substrate is etched while using the thus-obtained photoresist pattern as a protective film, thereby forming fine irregularities corresponding to the pattern on the substrate surface. In addition to the conventionally used active rays such as i-ray (365 nm wavelength), KrF excimer laser beam (248 nm wavelength) and ArF excimer laser beam (193 nm wavelength), EUV light (13.5 nm wavelength) and EB (electron beam) have become studied for practical use in the leading-edge microprocessing due to the recent increase in the packing density of semiconductor devices. In order to control the shape of a resist pattern, a method to form a resist underlayer film layer between a resist and a semiconductor substrate has widely been used.

Patent Literature 1 discloses an additive for a resist underlayer film-forming composition, which additive contains a copolymer containing fluorine atoms. Patent Literature 2 discloses a polymer for use in a resist underlayer film-forming composition, which polymer includes a structural unit containing fluorine atoms.

CITATION LIST

Patent Literature

Patent Literature 1: WO 2010/074075 A1
Patent Literature 2: JP 2015-143360 A

SUMMARY OF INVENTION

Technical Problem

The properties required of resist underlayer films are, for example, that the resist underlayer film is not intermixed with a resist film formed on top thereof (is insoluble in a resist solvent) and that the dry etching rate is higher than that of a resist film.

In EUV lithography, the line width of a resist pattern that is formed is 32 nm or less. Thus, a resist underlayer film for EUV exposure is formed with a smaller film thickness than the conventional one. It has been difficult to form such a thin uniform film free from defects, since such a film tends to have pinholes and aggregations due to the influence of, for example, the substrate surface and the polymer that is used.

Meanwhile, in the formation of a resist pattern, a resist is sometimes developed by removing unexposed portions of the resist film with a solvent, usually an organic solvent, capable of dissolving the resist film, thus leaving the exposed portions of the resist film as a resist pattern. In such a negative development process, the major challenge resides in improving the adhesion of the resist pattern.

Moreover, there are demands for formation of a resist pattern with a good rectangular shape while suppressing the deterioration in LWR (line width roughness, variation (roughness)) in line width) at the time of resist pattern formation, and for enhancement of the resist sensitivity.

Objects of the present invention are to provide a composition for forming a resist underlayer film that permits formation of a desired resist pattern, and to provide a resist pattern forming method using the resist underlayer film-forming composition, thereby solving the problems discussed above.

Solution to Problem

The present invention embraces the following.

[1] An EUV resist underlayer film-forming composition comprising:

an organic solvent; and a reaction product of a compound represented by formula (1) below with a diepoxy compound:

[Chem. 1]

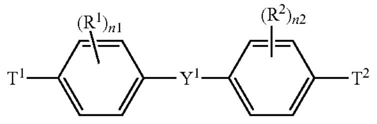

(1)

(in formula (1), $Y^1$ denotes a C1-C10 alkylene group of which at least one of hydrogen atoms is substituted by a fluorine atom, $T^1$ and $T^2$ each independently denote a hydroxy group or a carboxy group, $R^1$ and $R^2$ each independently denote a C1-C10 alkyl group optionally substituted by a fluorine atom, and n1 and n2 each independently denote an integer of 0 to 4).

[2] The EUV resist underlayer film-forming composition according to [1], wherein $Y^1$ is a C1-C10 alkylene group of which all of hydrogen atoms are substituted by fluorine atoms.

[3] The EUV resist underlayer film-forming composition according to [1] or [2], wherein the reaction product comprises a structural unit derived from the compound represented by formula (1) in a molar ratio of 50% by mole or more.

[4] The EUV resist underlayer film-forming composition according to any one of [1] to [3], further comprising a crosslinking agent.

[5] The EUV resist underlayer film-forming composition according to any one of [1] to [4], further comprising a crosslinking catalyst.

[6] The EUV resist underlayer film-forming composition according to any one of [1] to [5], wherein the diepoxy compound is a compound containing a heterocycle.

[7] An EUV resist underlayer film, which is a baked product of a coating film comprising the EUV resist underlayer film-forming composition according to any one of [1] to [6].

[8] A method for producing a patterned substrate, comprising the steps of:

applying the EUV resist underlayer film-forming composition according to any one of [1] to [6] onto a semiconductor substrate followed by baking to form an EUV resist underlayer film;

applying an EUV resist onto the EUV resist underlayer film followed by baking to form an EUV resist film;

exposing the semiconductor substrate coated with the EUV resist underlayer film and the EUV resist; and developing the exposed EUV resist film followed by patterning.

[9] A method for manufacturing a semiconductor device, comprising the steps of:

forming on a semiconductor substrate an EUV resist underlayer film comprising the EUV resist underlayer film-forming composition according to any one of [1] to [6];

forming an EUV resist film on the EUV resist underlayer film;

applying a light or electron beam to the EUV resist film followed by development to form an EUV resist pattern;

etching the EUV resist underlayer film through the formed EUV resist pattern to form a patterned EUV resist underlayer film; and processing the semiconductor substrate through the patterned EUV resist underlayer film.

Advantageous Effects of Invention

Attributable to the features above, the EUV resist underlayer film-forming composition according to the present application enables, especially at the time of resist pattern formation, suppression of the deterioration in LWR and enhancement of the sensitivity.

BRIEF DESCRIPTION OF DRAWINGS

FIG. 1 is a $^{1}$H-NMR chart of a polymer obtained in Synthesis Example 1.

DESCRIPTION OF EMBODIMENTS

<EUV Resist Underlayer Film-Forming Compositions>

An EUV resist underlayer film-forming composition of the present invention contains an organic solvent and a reaction product of a compound represented by formula (1) below with a diepoxy compound.

[Chem. 2]

(1)

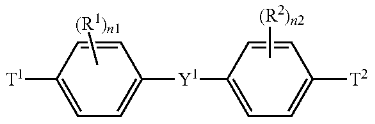

(In formula (1), $Y^1$ denotes a C1-C10 alkylene group of which at least one of hydrogen atoms is substituted by a fluorine atom, $T^1$ and $T^2$ each independently denote a hydroxy group or a carboxy group, $R^1$ and $R^2$ each independently denote a C1-C10 alkyl group optionally substituted by a fluorine atom, and n1 and n2 each independently denote an integer of 0 to 4.)

Examples of the C1-C10 alkylene groups include methylene group, ethylene group, n-propylene group, isopropylene group, cyclopropylene group, n-butylene group, isobutylene group, s-butylene group, t-butylene group, cyclobutylene group, 1-methyl-cyclopropylene group, 2-methyl-cyclopropylene group, n-pentylene group, 1-methyl-n-butylene group, 2-methyl-n-butylene group, 3-methyl-n-butylene group, 1,1-dimethyl-n-propylene group, 1,2-dimethyl-n-propylene group, 2,2-dimethyl-n-propylene, 1-ethyl-n-propylene group, cyclopentylene group, 1-methyl-cyclobutylene group, 2-methyl-cyclobutylene group, 3-methyl-cyclobutylene group, 1,2-dimethyl-cyclopropylene group, 2,3-dimethyl-cyclopropylene group, 1-ethyl-cyclopropylene group, 2-ethyl-cyclopropylene group, n-hexylene group, 1-methyl-n-pentylene group, 2-methyl-n-pentylene group, 3-methyl-n-pentylene group, 4-methyl-n-pentylene group, 1,1-dimethyl-n-butylene group, 1,2-dimethyl-n-butylene group, 1,3-dimethyl-n-butylene group, 2,2-dimethyl-n-butylene group, 2,3-dimethyl-n-butylene group, 3,3-dimethyl-n-butylene group, 1-ethyl-n-butylene group, 2-ethyl-n-butylene group, 1,1,2-trimethyl-n-propylene group, 1,2,2-trimethyl-n-propylene group, 1-ethyl-1-methyl-n-propylene group, 1-ethyl-2-methyl-n-propylene group, cyclohexylene group, 1-methyl-cyclopentylene group, 2-methyl-cyclopentylene group, 3-methyl-cyclopentylene group, 1-ethyl-cyclobutylene group, 2-ethyl-cyclobutylene group, 3-ethyl-cyclobutylene group, 1,2-dimethyl-cyclobutylene group, 1,3-dimethyl-cyclobutylene group, 2,2-dimethyl-cyclobutylene group, 2,3-dimethyl-cyclobutylene group, 2,4-dimethyl-cyclobutylene group, 3,3-dimethyl-cyclobutylene group, 1-n-propyl-cyclopropylene group, 2-n-propyl-cyclopropylene group, 1-isopropyl-cyclopropylene group, 2-isopropyl-cyclopropylene group, 1,2,2-trimethyl-cyclopropylene group, 1,2,3-trimethyl-cyclopropylene group, 2,2,3-trimethyl-cyclopropylene group, 1-ethyl-2-methyl-cyclopropylene group, 2-ethyl-1-methyl-cyclopropylene group, 2-ethyl-2-methyl-cyclopropylene group, 2-ethyl-3-methyl-cyclopropylene group, n-heptylene group, n-octylene group, n-nonylene group and n-decanylene group.

Examples of the C1-C10 alkyl groups include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, sropyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group and decyl group.

$Y^1$ is preferably a C1-C10 alkylene group of which all of hydrogen atoms are substituted by fluorine atoms. $Y^1$ is preferably a group represented by:

$$—C(CF_2)_2— \quad \text{[Chem. 3]}$$

Preferably, n1 and n2 are both 0 (zero).

Specific examples of the compounds represented by formula (1) include, but are not limited to, those compounds represented by the following formulas.

[Chem. 4]

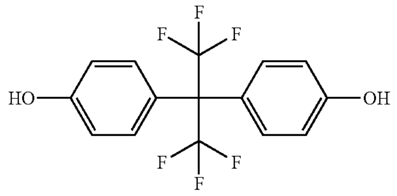

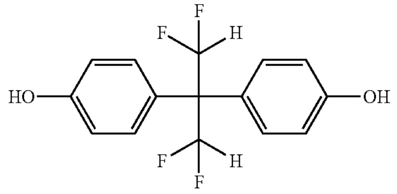

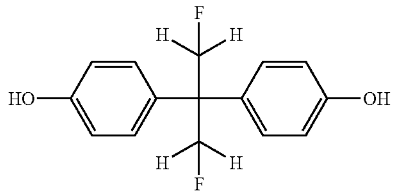

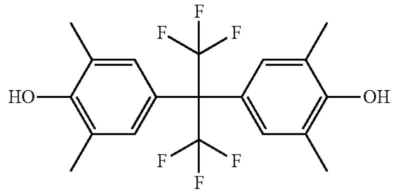

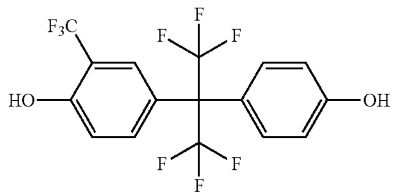

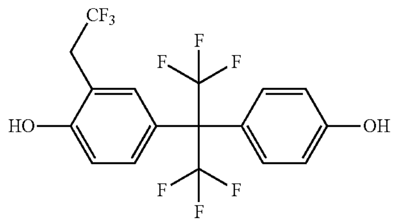

-continued

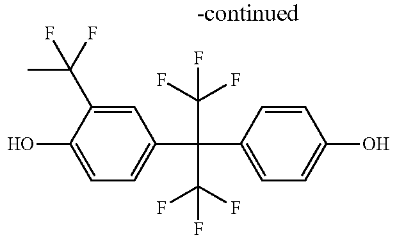

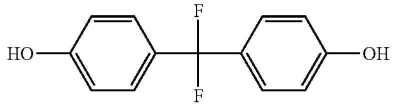

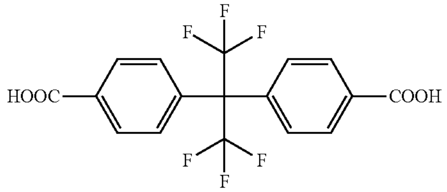

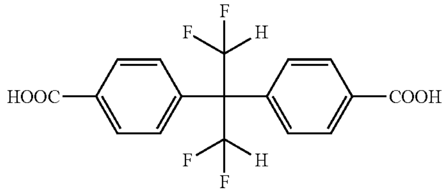

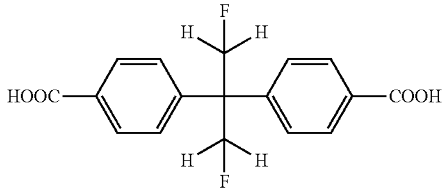

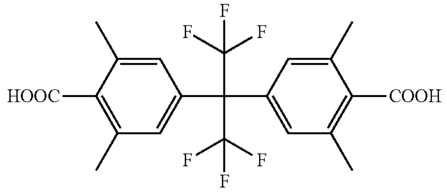

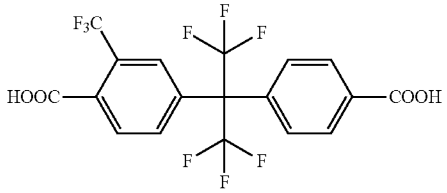

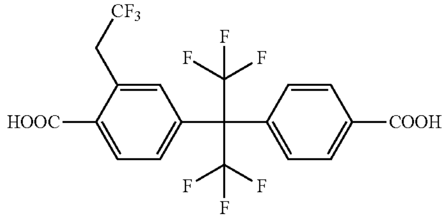

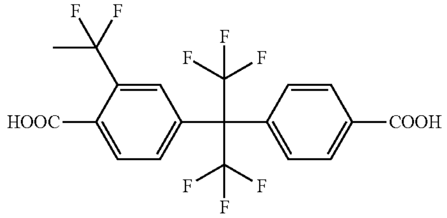

-continued

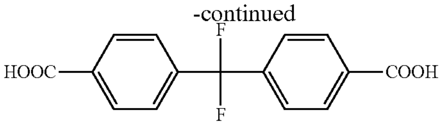

<Diepoxy Compounds>

The EUV resist underlayer film-forming composition of the present application contains a reaction product (a copolymer) obtained by reacting the compound represented by formula (1) with a diepoxy compound by a known method.

The diepoxy compound is not particularly limited as long as the compound has two epoxy groups in the molecule, but preferably comprises a compound containing a heterocycle.

For example, the molar ratio of the compound represented by formula (1) charged to the diepoxy compound charged in the reaction ranges 50:50 to 30:70.

In the reaction product, the molar ratio of the compound represented by formula (1) is preferably 50% by mole or more, 60% by mole or more, or 70% by mole or more. The fluorine atoms contained in the compound represented by formula (1) would make it possible to exhibit enhanced sensitivity at the time of EUV resist exposure.

The fluorine content (% by weight) with respect to the whole of the reaction product is preferably 10% by weight or more, and more preferably 15% by weight or more. The upper limit is, for example, 50% by weight.

For example, the weight average molecular weight of the reaction product (the polymer) is within the range of 2,000 to 50,000. For example, the weight average molecular weight may be determined by gel permeation chromatography as in Examples.

The proportion of the reaction product contained in the whole of the EUV resist underlayer film-forming composition of the present application is preferably within the range of 0.1% by weight to 1.0% by weight.

Specific examples of the compounds that are used to produce the reaction products of the present application include, but are not limited to, those compounds represented by the following formulas:

[Chem. 5]

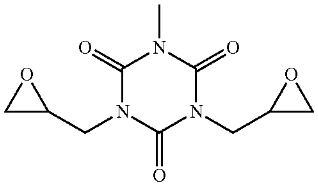

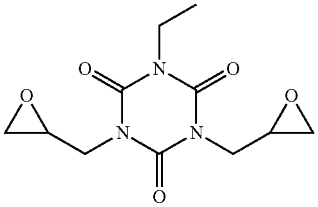

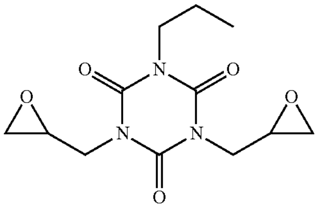

-continued

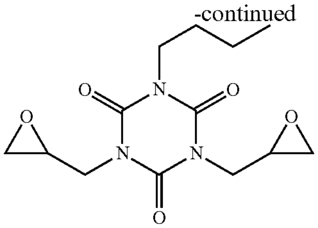

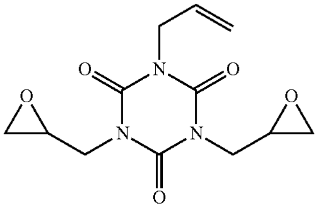

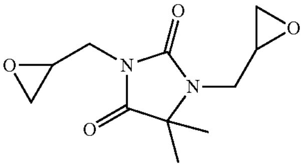

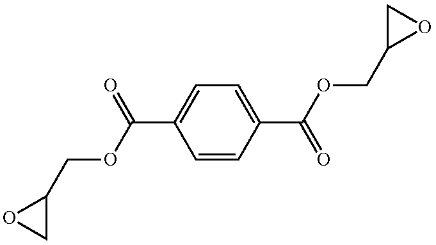

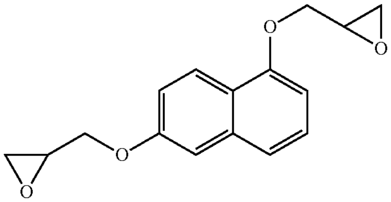

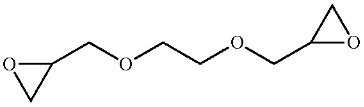

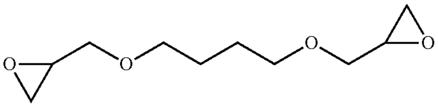

<Organic Solvents>

Examples of the organic solvents contained in the EUV resist underlayer film-forming compositions of the present invention include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide and N,N-dimethylacetamide. The solvents may be used each alone or two or more thereof in combination.

Of the solvents mentioned above, for example, propylene glycol monomethyl ether, propylene glycol monomethyl ether acetate, ethyl lactate, butyl lactate and cyclohexanone are preferable. In particular, propylene glycol monomethyl ether and propylene glycol monomethyl ether acetate are preferable.

<Crosslinking Agents>

The EUV resist underlayer film-forming composition of the present invention may include a crosslinking agent as an optional component. Examples thereof include hexamethoxymethylmelamine, tetramethoxymethylbenzoguanamine, 1,3,4,6-tetrakis(methoxymethyl)glycoluril (tetramethoxymethylglycoluril) (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea and 2,4,6-tris[bis(methoxymethyl)amino]-1,3,5-triazine ((product names) CYMEL [registered trademark]-303, NICALACK [registered trademark] MW-390).

Furthermore, the crosslinking agents in the present application may be nitrogen-containing compounds according to WO 2017/187969 A1 that have in the molecule 2 to 6 substituents represented by formula (1X) below which are bonded to nitrogen atoms.

[Chem. 6]

(1X)

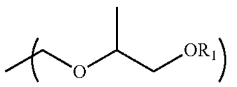

(In formula (1X), $R_1$ denotes a methyl group or an ethyl group.)

The nitrogen-containing compounds that have in the molecule 2 to 6 substituents represented by formula (1X) may be glycoluril derivatives represented by formula (1A) below:

[Chem. 7]

(1A)

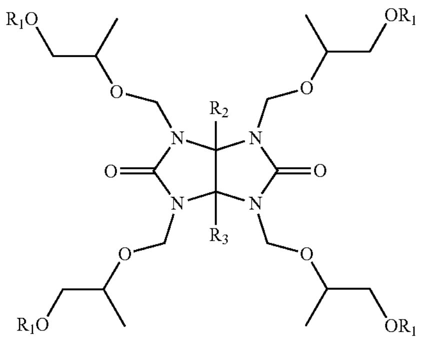

(In formula (1A), the four $R_1$s each independently denote a methyl group or an ethyl group, and $R_2$ and $R_3$ each independently denote a hydrogen atom, a C1-C4 alkyl group or a phenyl group.)

Examples of the glycoluril derivatives represented by formula (1A) include compounds represented by the following formulas (1A-1) to (1A-6):

[Chem. 8]

(1A-1)

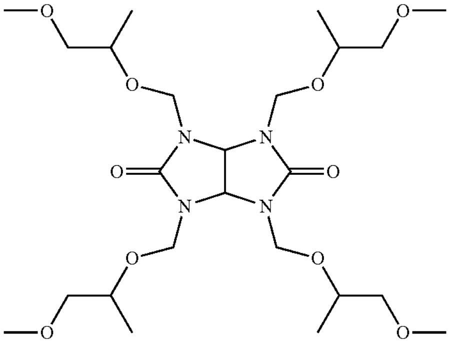

(1A-2)

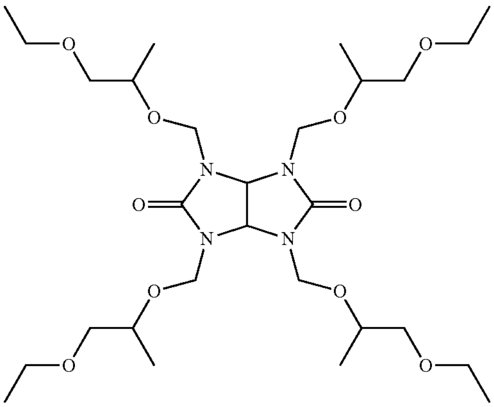

(1A-3)

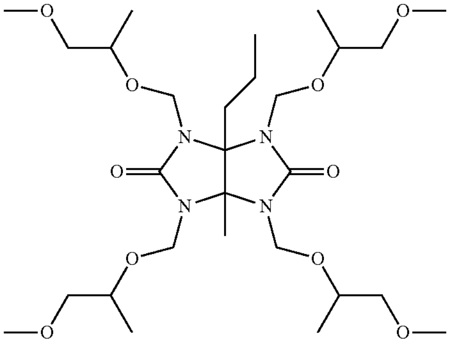

(1A-4)

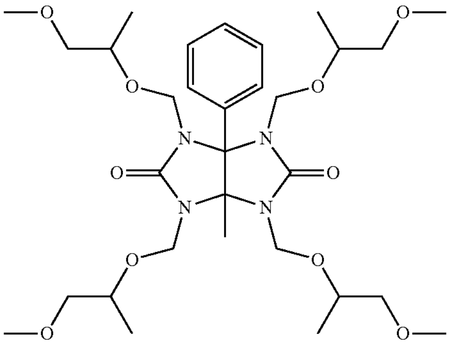

-continued (1A-5)

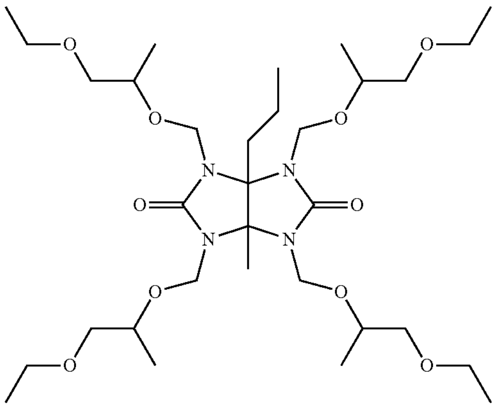

(1A-6)

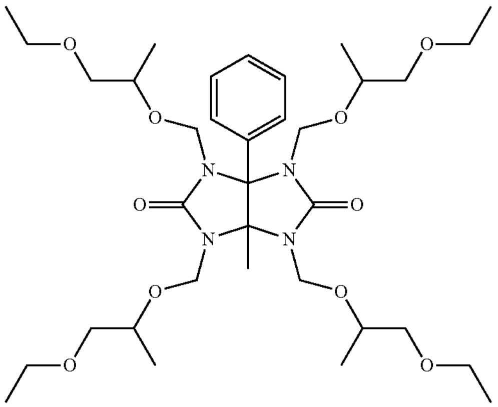

The compound represented by formula (1A) is obtained by allowing a nitrogen-containing compound that has in the molecule 2 to 6 substituents represented by formula (2) below which are bonded to nitrogen atoms to react with at least one compound represented by formula (3) below, to produce a nitrogen-containing compound that has in the molecule 2 to 6 substituents represented by the above formula (1X).

[Chem. 9]

(2)

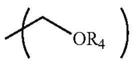

(3)

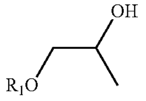

(In formula (2) and formula (3), $R_1$ denotes a methyl group or an ethyl group, and $R_4$ denotes a C1-C4 alkyl group.)

The glycoluril derivative represented by formula (1A) is obtained by allowing a glycoluril derivative represented by formula (2A) below to react with at least one compound represented by the above formula (3).

For example, the nitrogen-containing compound that has in the molecule 2 to 6 substituents represented by formula (2) is a glycoluril derivative represented by formula (2A) below:

[Chem. 10]

(2A)

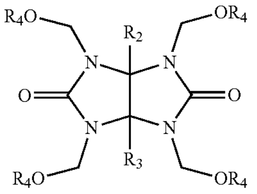

(In formula (2A), $R_2$ and $R_3$ each independently denote a hydrogen atom, a C1-C4 alkyl group or a phenyl group, and $R_4$ independently at each occurrence denotes a C1-C4 alkyl group.)

Examples of the glycoluril derivatives represented by formula (2A) include compounds represented by formulas (2A-1) to (2A-4) below. Furthermore, examples of the compounds represented by formula (3) include compounds represented by formulas (3-1) and (3-2) below.

[Chem. 11]

(2A-1)

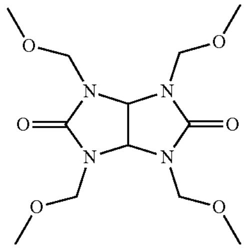

(2A-2)

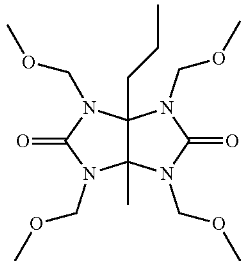

(2A-3)

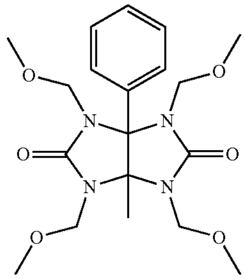

-continued (2A-4)

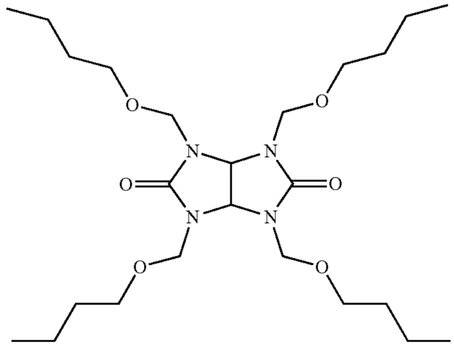

[Chem. 12]

(3-1)

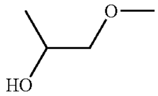

(3-2)

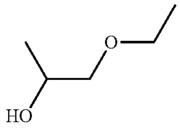

The details of the nitrogen-containing compounds that have in the molecule 2 to 6 substituents represented by formula (1X) which are bonded to nitrogen atoms are incorporated herein by reference to WO 2017/187969 A1.

When the crosslinking agent is used, the content of the crosslinking agent is, for example, within the range of 1% by mass to 50% by mass, and preferably 5% by mass to 30% by mass relative to the polymer.

<Crosslinking Catalysts (Curing Catalysts)>

Examples of the crosslinking catalyst (a curing catalyst) contained as an optional component in the EUV resist underlayer film-forming composition of the present invention include sulfonic acid compounds and carboxylic acid compounds such as p-toluenesulfonic acid, trifluoromethanesulfonic acid, pyridinium-p-toluenesulfonate (pyridinium-p-toluenesulfonic acid), pyridinium-p-hydroxybenzenesulfonic acid (pyridinium p-phenolsulfonate salt), pyridinium-trifluoromethanesulfonic acid, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid and hydroxybenzoic acid. When the crosslinking catalyst is used, the content of the crosslinking catalyst is, for example, within the range of 0.1% by mass to 50% by mass, and preferably 1% by mass to 30% by mass relative to the crosslinking agent.

<Additional Components>

To eliminate the occurrence of defects such as pinholes or striation and to further enhance the applicability to surface unevenness, the resist underlayer film-forming composition of the present invention may further include a surfactant. Examples of the surfactants include nonionic surfactants such as polyoxyethylene alkyl ethers including polyoxyethylene lauryl ether, polyoxyethylene stearyl ether, polyoxyethylene cetyl ether and polyoxyethylene oleyl ether, polyoxyethylene alkylallyl ethers including polyoxyethylene octylphenol ether and polyoxyethylene nonylphenol ether, polyoxyethylene/polyoxypropylene block copolymers, sorbitan fatty acid esters including sorbitan monolaurate, sorbitan monopalmitate, sorbitan monostearate, sorbitan monooleate, sorbitan trioleate and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, fluorosurfactants such as EFTOP series EF301, EF303 and EF352 (product names, manufactured by Tohkem Products Corp.), MEGAFACE series F171, F173 and R-30 (product names, manufactured by DIC CORPORATION), Fluorad series FC430 and FC431 (product names, manufactured by Sumitomo 3M Limited), Asahi-Guard AG710, and Surflon series S-382, SC101, SC102, SC103, SC104, SC105 and SC106 (product names, manufactured by AGC Inc.), and organosiloxane polymer KP341 (manufactured by Shin-Etsu Chemical Co., Ltd.). The amount of the surfactant is usually 2.0% by mass or less, and preferably 1.0% by mass or less of the total solid content of the resist underlayer film-forming composition of the present invention. The surfactants may be used each alone or two or more thereof in combination.

<EUV Resist Underlayer Films>

An EUV resist underlayer film of the present invention may be produced by applying the EUV resist underlayer film-forming composition described hereinabove onto a semiconductor substrate and baking the composition.

Examples of the semiconductor substrates to which the resist underlayer film-forming composition of the present invention is applied include silicon wafers, germanium wafers, and compound semiconductor wafers such as gallium arsenide, indium phosphide, gallium nitride, indium nitride and aluminum nitride.

The semiconductor substrate that is used may have an inorganic film on its surface. For example, such an inorganic film is formed by ALD (atomic layer deposition), CVD (chemical vapor deposition), reactive sputtering, ion plating, vacuum deposition or spin coating (spin on glass: SOG). Examples of the inorganic films include polysilicon films, silicon oxide films, silicon nitride films, BPSG (boro-phospho silicate glass) films, titanium nitride films, titanium oxynitride films, tungsten films, gallium nitride films and gallium arsenide films.

The resist underlayer film-forming composition of the present invention is applied onto such a semiconductor substrate with an appropriate applicator such as a spinner or a coater. Thereafter, the composition is baked with a heating device such as a hot plate to form a resist underlayer film. The baking conditions are appropriately selected from baking temperatures of 100° C. to 400° C. and amounts of baking time of 0.3 μminutes to 60 μminutes. Preferably, the baking temperature is 120° C. to 350° C. and the baking time is 0.5 μminutes to 30 μminutes. More preferably, the baking temperature is 150° C. to 300° C. and the baking time is 0.8 μminutes to 10 μminutes.

The film thickness of the EUV resist underlayer film that is formed is, for example, within the range of 0.001 μm (1 nm) to 10 μm, 0.002 μm (2 nm) to 1 μm, 0.005 μm (5 nm) to 0.5 μm (500 nm), 0.001 μm (1 nm) to 0.05 μm (50 nm), 0.002 μm (2 nm) to 0.05 μm (50 nm), 0.003 μm (1 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (20 nm), or 0.005 μm (5 nm) to 0.02 μm (20 nm).

If the baking temperature is lower than the range mentioned above, crosslinking is insufficient. If, on the other hand, the baking temperature is higher than the above range, the resist underlayer film may be decomposed by heat.

<Method for Producing Patterned Substrate, and Method for Manufacturing Semiconductor Device>

A patterned substrate is produced through the following steps. Usually, a patterned substrate is produced by forming a photoresist layer on the EUV resist underlayer film. The photoresist that is formed on the EUV resist underlayer film by application and baking according to a method known per se is not particularly limited as long as the resist is sensitive to light used for exposure. Any of negative photoresists and positive photoresists may be used, including positive photoresists composed of a novolak resin and 1,2-naphthoquinonediazide sulfonic acid ester; chemically amplified photoresists composed of a photoacid generator and a binder having a group that is decomposed by an acid to increase the alkali dissolution rate; chemically amplified photoresists composed of an alkali-soluble binder, a photoacid generator and a low-molecular compound that is decomposed by an acid to increase the alkali dissolution rate of the photoresist; chemically amplified photoresists composed of a photoacid generator, a binder having a group that is decomposed by an acid to increase the alkali dissolution rate, and a low-molecular compound that is decomposed by an acid to increase the alkali dissolution rate of the photoresist; and resists containing metal elements. Examples thereof include V146G, product name, manufactured by JSR CORPORATION, APEX-E, product name, manufactured by Shipley, PAR710, product name, manufactured by Sumitomo Chemical Co., Ltd., and AR2772 and SEPR430, product names, manufactured by Shin-Etsu Chemical Co., Ltd. Examples thereof further include fluorine-containing polymer photoresists such as those according to Proc. SPIE, Vol. 3999, 330-334 (2000), Proc. SPIE, Vol. 3999, 357-364 (2000) and Proc. SPIE, Vol. 3999, 365-374 (2000).

Moreover, also may be used, but not limited thereto, the so-called resist compositions and metal-containing resist compositions such as resist compositions, radiation-sensitive resin compositions, and high-resolution patterning compositions based on organic metal solutions according to, for example, WO 2019/188595, WO 2019/187881, WO 2019/187803, WO 2019/167737, WO 2019/167725, WO 2019/187445, WO 2019/167419, WO 2019/123842, WO 2019/054282, WO 2019/058945, WO 2019/058890, WO 2019/039290, WO 2019/044259, WO 2019/044231, WO 2019/026549, WO 2018/193954, WO 2019/172054, WO 2019/021975, WO 2018/230334, WO 2018/194123, JP 2018-180525, WO 2018/190088, JP 2018-070596, JP 2018-028090, JP 2016-153409, JP 2016-130240, JP 2016-108325, JP 2016-047920, JP 2016-035570, JP 2016-035567, JP 2016-035565, JP 2019-101417, JP 2019-117373, JP 2019-052294, JP 2019-008280, JP 2019-008279, JP 2019-003176, JP 2019-003175, JP 2018-197853, JP 2019-191298, JP 2019-061217, JP 2018-045152, JP 2018-022039, JP 2016-090441, JP 2015-10878, JP 2012-168279, JP 2012-022261, JP 2012-022258, JP 2011-043749, JP 2010-181857, JP 2010-128369, WO 2018/031896, JP 2019-113855, WO 2017/156388, WO 2017/066319, JP 2018-41099, WO 2016/065120, WO 2015/026482, JP 2016-29498 and JP 2011-253185.

Examples of the resist composition include the following.

(i) An active ray-sensitive or radiation-sensitive resin composition that includes a resin A which has a repeating unit containing an acid-decomposable group in which a polar group is protected by a protective group capable of being detached by the action of an acid, and a compound represented by the general formula (11).

[Chem. 13]

(11)

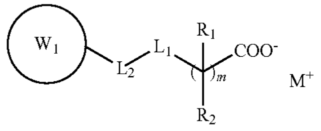

In the general formula (11), m denotes an integer of 1 to 6.

$R_1$ and $R_2$ each independently denote a fluorine atom or a perfluoroalkyl group.

$L_1$ denotes —O—, —S—, —COO—, —$SO_2$— or —$SO_3$—.

$L_2$ denotes an optionally substituted alkylene group or a single bond.

$W_1$ denotes an optionally substituted cyclic organic group.

$M^+$ denotes a cation.

(ii) A metal-containing film-forming composition for extreme ultraviolet or electron beam lithography that includes a solvent and a compound having a metal-oxygen covalent bond. Here, the metal element constituting the compound belongs to Period 3 to Period 7 of Group 3 to Group 15 of the periodic table.

(iii) A radiation-sensitive resin composition that includes an acid generator, and a polymer which has a first structural unit represented by formula (21) below and a second structural unit of formula (22) below containing an acid-dissociative group.

[Chem. 14]

(21)

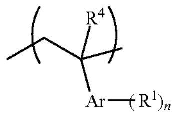

(22)

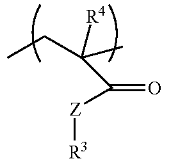

(In formula (21), Ar is a residue in which (n+1) quantity of hydrogen atoms have been removed from a C6-C20 arene. $R^1$ is a hydroxy group, a sulfanyl group or a C1-C20 μmonovalent organic group. The letter n is an integer of 0 to 11. When n is 2 or greater, the groups $R^1$ are the same as or different from one another. $R^2$ is a hydrogen atom, a fluorine atom, a methyl group or a trifluoromethyl group.

In formula (22), $R^3$ is a C1-C20 μmonovalent group including the acid-dissociative group. Z is a single bond, an oxygen atom or a sulfur atom. $R^4$ is a hydrogen atom, a fluorine atom, a methyl group or a trifluoromethyl group.)

(iv) A resist composition that includes an acid generator, and a resin (A1) which contains a structural unit having a cyclic carbonate ester structure, a structural unit represented by formula (II), and a structural unit having an acid-labile group.

[Chem.15]

(II)

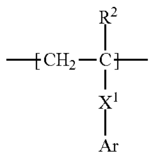

[In formula (II), $R^2$ denotes an optionally halogenated C1-C6 alkyl group, a hydrogen atom or a halogen atom, $X^1$ denotes a single bond, —CO—O—* or —CO—$NR^4$—*, * indicates a bond to —Ar, $R^4$ denotes a hydrogen atom or a C1-C4 alkyl group, and Ar denotes a C6-C20 aromatic hydrocarbon group optionally having one or more groups selected from the group consisting of hydroxy group and carboxyl groups.]

(v) A resist composition that generates an acid upon exposure and changes their solubility in a developer by the action of the acid.

The resist compositions include a substrate component (A) that changes the solubility in a developer by the action of an acid, and a fluorine additive component (F) that exhibits decomposability in an alkaline developer.

The fluorine additive component (F) comprises a fluororesin component (F1) that contains a constituent unit (f1) containing a base-dissociative group, and a constituent unit (f2) containing a group represented by the general formula (f2-r-1) below.

[Chem. 16]

(f2-r-1)

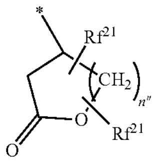

[In formula (f2-r-1), $Rf^{21}$ independently at each occurrence is a hydrogen atom, an alkyl group, an alkoxy group, a hydroxy group, a hydroxyalkyl group or a cyano group. The letter n" is an integer of 0 to 2. * is a bond.]

(vi) The resist composition described above in (v), in which the constituent unit (f1) comprises a constituent unit represented by the general formula (f1-1) below or a constituent unit represented by the general formula (f1-2) below.

[Chem. 17]

(f1-1)

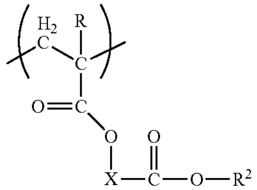

-continued (f1-2)

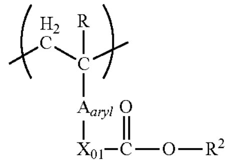

[In formula (f1-1) and formula (f1-2), R independently at each occurrence is a hydrogen atom, a C1-C5 alkyl group or a C1-C5 alkyl halide group. X is a divalent linking group having no acid-dissociative sites. $A_{aryl}$ is an optionally substituted, divalent aromatic cyclic group. $X_{01}$ is a single bond or a divalent linking group. $R^2$ independently at each occurrence is an organic group having a fluorine atom.]

Examples of the metal-containing resist compositions include coatings that contain a metal oxo-hydroxo network which has an organic ligand through a metal-carbon bond and/or a metal-carboxylate bond.

(vii) An inorganic oxo/hydroxo-based composition.

Examples of the resist film include the following.

(i) A resist film that includes a base resin which contains a repeating unit represented by formula (a1) below and/or a repeating unit represented by formula (a2) below, and a repeating unit which generates, upon exposure, an acid bonded to the polymer main chain.

[Chem. 18]

(a1)

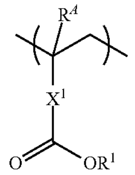

(a2)

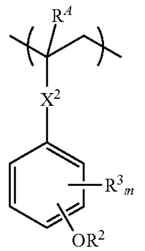

(In formula (a1) and formula (a2), $R^A$ independently at each occurrence is a hydrogen atom or a methyl group. $R^1$ and $R^2$ are each independently a C4-C6 tertiary alkyl group. $R^3$ independently at each occurrence is a fluorine atom or a methyl group. The letter m is an integer of 0 to 4. $X^1$ is a single bond, a phenylene group or a naphthylene group, or is a C1-C12 linking group including at least one selected from ester bonds, lactone rings, phenylene groups and naphthylene groups. $X^2$ is a single bond, an ester bond or an amide bond.)

Examples of the resist material include the following.

(i) A resist material that includes a polymer which has a repeating unit represented by formula (a1) or (a2) below.

[Chem. 19]

(a1)

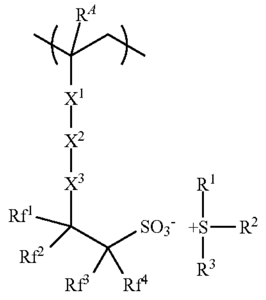

(a2)

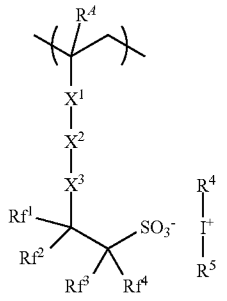

(In formula (a1) and formula (a2), $R^A$ is a hydrogen atom or a methyl group. $X^1$ is a single bond or an ester group. $X^2$ is a linear, branched or cyclic C1-C12 alkylene group or a C6-C10 arylene group, wherein part of the methylene groups constituting the alkylene group may be replaced by an ether group, an ester group or a lactone ring-containing group, and at least one hydrogen atom in $X^2$ is replaced by a bromine atom. $X^3$ is a single bond, an ether group, an ester group, or a C1-C12 linear, branched or cyclic alkylene group, wherein part of the methylene groups constituting the alkylene group may be replaced by an ether group or an ester group. $Rf^1$ to $Rf^4$ are each independently a hydrogen atom, a fluorine atom or a trifluoromethyl group, and at least one of them is a fluorine atom or a trifluoromethyl group. Also, $Rf^1$ and $Rf^2$ may be combined to form a carbonyl group. $R^1$ to $R^5$ are each independently a linear, branched or cyclic C1-C12 alkyl group, a linear, branched or cyclic C2-C12 alkenyl group, a C2-C12 alkynyl group, a C6-C20 aryl group, a C7-C12 aralkyl group or a C7-C12 aryloxyalkyl group, wherein part or all of the hydrogen atoms of these groups may be replaced by a hydroxy group, a carboxy group, a halogen atom, an oxo group, a cyano group, an amide group, a nitro group, a sultone group, a sulfone group or a sulfonium salt-containing group, and part of the methylene groups constituting these groups may be replaced by an ether group, an ester group, a carbonyl group, a carbonate group or a sulfonic acid ester group. Also, $R^1$ and $R^2$ may be bonded to each other to form a ring together with the sulfur atom to which they are bonded.)

(ii) A resist material that includes a base resin which includes a polymer containing a repeating unit represented by formula (a) below.

[Chem. 20]

(a)

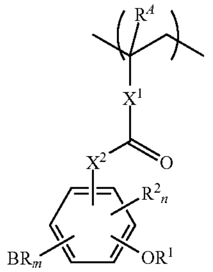

(In formula (a), $R^A$ is a hydrogen atom or a methyl group. $R^1$ is a hydrogen atom or an acid-labile group. $R^2$ is a linear, branched or cyclic C1-C6 alkyl group or a halogen atom other than bromine. $X^1$ is a single bond or a phenylene group, or is a linear, branched or cyclic C1-C12 alkylene group optionally containing an ester group or a lactone ring. $X^2$ is —O—, —O—$CH_2$— or —NH—. The letter m is an integer of 1 to 4. The letter n is an integer of 0 to 3.)

Examples of the coating solution include the following.

(i) A coating solution that includes an organic solvent; a first organic metal composition which is represented by the formula $R_zSnO_{(2-(z/2)(x/2))}(OH)_x$ (where $0<z\leq 2$ and $0<(z+x)\leq 4$) or the formula $R'_nSnX_{4-n}$(where n=1 or 2) or is a mixture thereof, wherein R and R' are independently a C1-C31 hydrocarbyl group, and X is a ligand having a hydrolyzable bond to Sn or is a combination of such ligands; and a hydrolyzable metal compound represented by the formula $MX'_v$(where M is a metal selected from Group 2 to Group 16 of the periodic table of the elements, v=a number of 2 to 6, and X' is a ligand having a hydrolyzable M—X bond or is a combination of such ligands).

(ii) A coating solution that includes an organic solvent and a first organic metal compound represented by the formula $RSnO_{(3/2-x/2)}(OH)_x$(where $0<x<3$) wherein the solution contains about 0.0025 M to about 1.5 M of tin, R is a C3-C31 alkyl or cycloalkyl group, and the alkyl or cycloalkyl group is bonded to tin through its secondary or tertiary carbon atom.

(iii) An inorganic pattern-forming precursor aqueous solution that includes a mixture of water, a metal suboxide cation, a polyatomic inorganic anion, and a radiation-sensitive ligand containing a peroxide group.

Exposure is performed using, for example, i-ray, KrF excimer laser beam, ArF excimer laser beam, EUV (extreme ultraviolet ray) or EB (electron beam) through a mask (a reticle) designed to form a predetermined pattern. EUV (extreme ultraviolet ray) is preferably used for the exposure of the resist underlayer film-forming composition of the present application. An alkaline developer is used for the development, and the conditions are appropriately selected from development temperatures of 5° C. to 50° C. and amounts of development time of 10 seconds to 300 seconds. Examples of the alkaline developers that may be used include aqueous solutions of alkalis such as inorganic alkalis including sodium hydroxide, potassium hydroxide, sodium carbonate, sodium silicate, sodium metasilicate and aqueous ammonia; primary amines including ethylamine and n-propylamine; secondary amines including diethylamine and di-n-butylamine; tertiary amines including triethylamine and methyldiethylamine; alcohol amines including dimethylethanolamine and triethanolamine; quaternary ammonium salts including tetramethylammonium hydroxide, tetraethylammonium hydroxide and choline; and cyclic amines including pyrrole and piperidine. Appropriate amounts of alcohols such as isopropyl alcohol and surfactants such as nonionic surfactants may be added to the aqueous alkali solutions mentioned above. Of the developers above, quaternary ammonium salts are preferable, and tetramethylammonium hydroxide and choline are more preferable. Additional components such as surfactants may be added to these developers. An organic solvent such as butyl acetate may be used in place of the alkali developer to develop the portions of photoresist remaining low in alkali dissolution rate. A substrate having a patterned resist may be produced through the steps described above.

Next, the resist underlayer film is dry-etched using as a mask the formed resist pattern. When the inorganic film described hereinabove is present on the surface of the semiconductor substrate that is used, the etching process exposes the surface of the inorganic film. When there is no inorganic film on the surface of the semiconductor substrate that is used, the etching process exposes the surface of the semiconductor substrate. The substrate is then processed by a method known per se (such as a dry etching method). A semiconductor device may be thus manufactured.

EXAMPLES

The present invention will be explained in detail by referring to the examples below. However, it should not be construed that the scope of the present invention is limited to such examples.

The weight average molecular weight of polymers according to Synthesis Examples and Comparative Synthesis Example in the present specification is the results measured by gel permeation chromatography (hereinafter, abbreviated as GPC). The measurement was performed using a GPC device manufactured by TOSOH CORPORATION under the following measurement conditions.

GPC columns: Shodex KF803L, Shodex KF802 and Shodex KF801 [registered trademark] (SHOWA DENKO K.K.)

Column temperature: 40° C.

Solvent: Tetrahydrofuran (THF)

Flow rate: 1.0 μml/min

Standard samples: Polystyrenes (manufactured by TOSOH CORPORATION)

Synthesis Example 1

7.00 g of monoallyl diglycidyl isocyanuric acid (manufactured by SHIKOKU CHEMICALS CORPORATION), 10.76 g of 2,2,2-bis-4-carboxyphenylhexafluoropropane (charged molar ratio: 46:54) and 0.30 g of tetrabutylphosphonium bromide (manufactured by ACROSS) were added to and dissolved in 27.09 g of propylene glycol monomethyl ether. The reaction vessel was purged with nitrogen and the reaction was carried out at 90° C. for 24 hours to obtain a polymer solution. The polymer solution was free from clouding etc. even after being cooled to room temperature, showing a good solubility in propylene glycol monomethyl ether. GPC analysis showed that the polymer in the obtained solution had a weight average molecular weight of 5,000 relative to standard polystyrenes. The polymer obtained in this synthesis example has structural units represented by the following formulas (1a) and (2a):

[Chem. 21]

(1a)

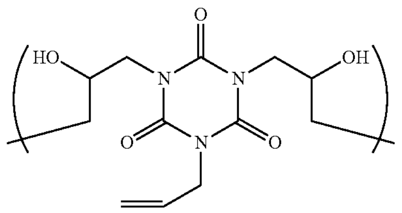

(2a)

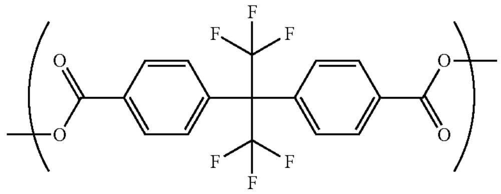

The proportions of (1a) and (2a) in the polymer obtained in Synthesis Example 1 were calculated by $^1$H-NMR analysis (manufactured by JEOL, 500 MHz). The measurement sample was prepared by adding 1.00 g of deuterated chloroform (manufactured by Tokyo Chemical Industry Co., Ltd.) to 0.5 g of the polymer solution obtained in Synthesis Example 1 containing 0.07 g of the polymer. The measurement was performed under the conditions: sample tube: 5 μmm, solvent: deuterated chloroform, measurement temperature: room temperature, pulse interval: 5 seconds, number of scans: 256, and reference sample: tetramethylsilane (TMS). The $^1$H-NMR chart is illustrated in FIG. 1.

$^1$H-NMR (500 MHz): 4.82 (d, 1H), 4.94 (d, 1H), 5.88 ppm (s, 1H), 7.09 ppm (d, 4H), 7.75 ppm (d, 4H)

The molar ratio of (1a) to (2a) was 50:50.

Synthesis Example 2

7.00 g of monoallyl diglycidyl isocyanuric acid (manufactured by SHIKOKU CHEMICALS CORPORATION), 8.80 g of 2,2,2-bis-4-hydroxyphenylhexafluoropropane (charged molar ratio: 46:54) and 0.30 g of tetrabutylphosphonium bromide (manufactured by ACROSS) were added to and dissolved in 27.09 g of propylene glycol monomethyl ether. The reaction vessel was purged with nitrogen and the reaction was carried out at 105° C. for 24 hours to obtain a polymer solution. The polymer solution was free from clouding etc. even after being cooled to room temperature, showing a good solubility in propylene glycol monomethyl ether. GPC analysis showed that the polymer in the obtained solution had a weight average molecular weight of 14,000 relative to standard polystyrenes. The polymer obtained in this synthesis example has structural units represented by the following formulas (1a) and (3a):

[Chem. 22]

(1a)

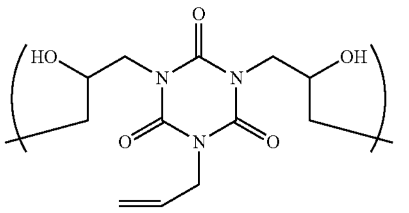

(3a)

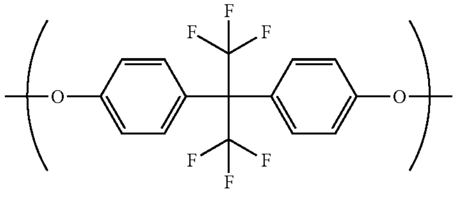

Comparative Synthesis Example 1

8.00 g of monoallyl diglycidyl isocyanuric acid (manufactured by Shikoku Chemicals Corporation), 5.45 g of barbital (manufactured by HACHIDAI PHARMACEUTICAL Co., Ltd.) and 0.48 g of tetrabutylphosphonium bromide (charged molar ratio: 46:54) were added to and dissolved in 56.00 g of propylene glycol monomethyl ether. The reaction vessel was purged with nitrogen and the reaction was carried out under reflux for 10 hours to obtain a polymer solution. The polymer solution was free from clouding etc. even after being cooled to room temperature, showing a good solubility in propylene glycol monomethyl ether. GPC analysis showed that the polymer in the obtained solution had a weight average molecular weight of 1,000 relative to standard polystyrenes. The polymer obtained in this synthesis example has structural units represented by the following formulas (1a) and (1b):

[Chem. 23]

(1a)

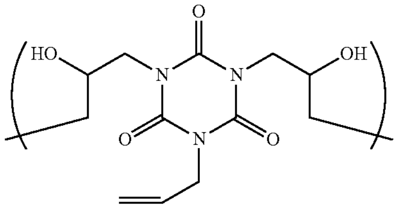

(1b)

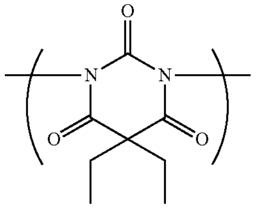

Example 1

3.12 g of the polymer solution obtained in Synthesis Example 1 that contained 0.47 g of the polymer was mixed with 0.11 g of tetramethoxymethyl glycoluril (manufactured by Cytec Industries Japan) and 0.012 g of pyridinium p-phenolsulfonic acid salt (manufactured by Tokyo Chemical Industry Co., Ltd.). The materials were dissolved by addition of 263.41 g of propylene glycol monomethyl ether and 29.89 g of propylene glycol monomethyl ether acetate. The resultant solution was filtered through a polyethylene microfilter having a pore size of 0.05 μm, to obtain a lithographic resist underlayer film-forming composition.

Example 2

3.12 g of the polymer solution obtained in Synthesis Example 2 that contained 0.47 g of the polymer was mixed with 0.11 g of tetramethoxymethyl glycoluril (manufactured by Cytec Industries Japan) and 0.012 g of pyridinium p-phenolsulfonic acid salt (manufactured by Tokyo Chemical Industry Co., Ltd.). The materials were dissolved by addition of 263.41 g of propylene glycol monomethyl ether and 29.89 g of propylene glycol monomethyl ether acetate. The resultant solution was filtered through a polyethylene microfilter having a pore size of 0.05 μm, to obtain a lithographic resist underlayer film-forming composition.

Comparative Example 1

3.12 g of the polymer solution obtained in Comparative Synthesis Example 1 that contained 0.047 g of the polymer was mixed with 0.11 g of tetramethoxymethyl glycoluril (manufactured by Cytec Industries Japan) and 0.012 g of pyridinium p-phenolsulfonic acid salt (manufactured by Tokyo Chemical Industry Co., Ltd.). The materials were dissolved by addition of 263.41 g of propylene glycol monomethyl ether and 29.89 g of propylene glycol monomethyl ether acetate. The resultant solution was filtered through a polyethylene microfilter having a pore size of 0.05 μm, to obtain a lithographic resist underlayer film-forming composition.

[Test of Dissolution into Photoresist Solvents]

Each of the resist underlayer film-forming compositions of Examples 1 and 2 and Comparative Example 1 was applied onto a silicon wafer as a semiconductor substrate using a spinner. Each of the silicon wafers was set on a hot plate and baked at 215° C. for 1 μminute to form a resist underlayer film (film thickness: 5 nm). These resist underlayer films were soaked in each of photoresist solvents, specifically, ethyl lactate and propylene glycol monomethyl ether. The resist underlayer films were insoluble in any of these solvents.

[Formation of Resist Pattern with Electron Beam Lithography System]

Each of the resist underlayer film-forming compositions of Examples 1 and 2 and Comparative Example 1 was applied onto a silicon wafer using a spinner. Each of the silicon wafers was baked on a hot plate at 205° C. for 60 seconds to form a resist underlayer film having a film thickness of 5 nm. On each of the resist underlayer films was spin-coated an EUV positive resist solution (containing a methacrylic polymer), and the coating was heated at 130° C. for 60 seconds to form an EUV resist film. The resist film was exposed under the predetermined conditions using an electron beam lithography system (ELS-G130). After the exposure, baking (PEB) was performed at 100° C. for 60 seconds. The resist film was then cooled to room temperature on a cooling plate and was developed with an alkaline developer (2.38% TMAH), to subsequently form a resist pattern having 25 nm lines/50 nm pitches. For the length measurement of the resist pattern, a scanning electron microscope (CG4100 manufactured by Hitachi High-Tech Corporation) was used. In the formation of the resist pattern, the exposure dose at which 25 nm lines/50 nm pitches (line and space (L/S=1/1) were successfully formed was taken as the optimum exposure dose.

The photoresist patterns thus obtained were observed from the upper side of the pattern and evaluated. The exposure doses required to form a 25 nm-line resist pattern are reported in Table 1.

TABLE 1

| | Exposure dose for 25 nm pattern | Normalized exposure dose | Fluorine content (mass %) (calculated) |
|---|---|---|---|
| Ex. 1 | 570 μC | 0.94 | 19.3 |
| Ex. 2 | 562 μC | 0.93 | 17.6 |
| Comp. Ex. 1 | 606 μC | 1.00 | 0 |

INDUSTRIAL APPLICABILITY

By the resist underlayer film-forming composition according to the present invention, there are provided a composition for forming a resist underlayer film that permits formation of a desired resist pattern, a method for producing a resist-patterned substrate and a method for manufacturing a semiconductor device using the resist underlayer film-forming composition.

The invention claimed is:

1. An EUV resist underlayer film-forming composition comprising:

an organic solvent;

a reaction product of a compound represented by formula (1) below with a diepoxy compound:

(1)

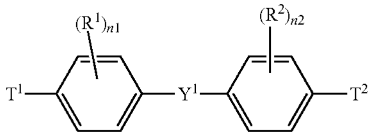

wherein in formula (1), $Y^1$ is a C1-C10 alkylene group in which all of hydrogen atoms are substituted by fluorine atoms, $T^1$ and $T^2$ each independently denote a carboxy group, $R^1$ and $R^2$ each independently denote a C1-C10 alkyl group optionally substituted by a fluorine atom, and n1 and n2 each independently denote an integer of 0 to 4, wherein the diepoxy compound is a compound containing a heterocycle; and a crosslinking agent selected from the group consisting of hexamethoxymethylmelamine,
tetramethoxymethylbenzoguanamine,
1,3,4,6-tetrakis(methoxymethyl)glycoluril,
1,3,4,6-tetrakis(butoxymethyl)glycoluril,
1,3,4,6-tetrakis(hydroxymethyl)glycoluril,
1,3-bis(hydroxymethyl)urea,
1,1,3,3-tetrakis(butoxymethyl)urea,
1,1,3,3-tetrakis(methoxymethyl)urea
2,4,6-tris[bis(methoxymethyl)amino]-1,3,5-triazine, and
glycoluril derivatives represented by formula (1A):

(1A)

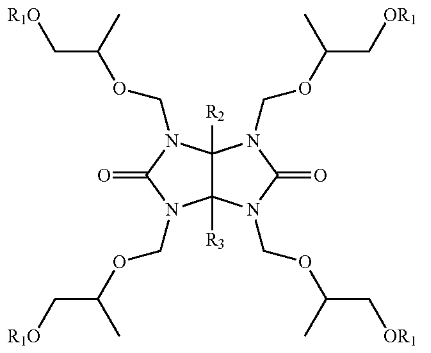

wherein in formula (1A), the four $R_{1S}$ each independently denote a methyl group or an ethyl group, and $R_2$ and $R_3$ each independently denote a hydrogen atom, a C1-C4 alkyl group or a phenyl group.

2. The EUV resist underlayer film-forming composition according to claim 1, wherein the reaction product comprises a structural unit derived from the compound represented by formula (1) in a molar ratio of 50% by mole or more.

3. The EUV resist underlayer film-forming composition according to claim 1, further comprising a curing catalyst.

4. An EUV resist underlayer film, which is a baked product of a coating film comprising the EUV resist underlayer film-forming composition according to claim 1.

5. A method for producing a patterned substrate, comprising the steps of:

applying the EUV resist underlayer film-forming composition according to claim 1 onto a semiconductor substrate followed by baking to form an EUV resist underlayer film;

applying an EUV resist onto the EUV resist underlayer film followed by baking to form an EUV resist film;

exposing the semiconductor substrate coated with the EUV resist underlayer film and the EUV resist; and developing the exposed EUV resist film followed by patterning.

6. A method for manufacturing a semiconductor device, comprising the steps of:

forming on a semiconductor substrate an EUV resist underlayer film comprising the EUV resist underlayer film-forming composition according to claim 1;

forming an EUV resist film on the EUV resist underlayer film;

applying a light or electron beam to the EUV resist film followed by development to form an EUV resist pattern;

etching the EUV resist underlayer film through the formed EUV resist pattern to form a patterned EUV resist underlayer film; and processing the semiconductor substrate through the patterned EUV resist underlayer film.

* * * * *